(12) United States Patent
Yu

(10) Patent No.: US 8,660,809 B2
(45) Date of Patent: Feb. 25, 2014

(54) METHOD FOR ACCURATE BATTERY RUN TIME ESTIMATION UTILIZING ADAPTIVE OFFSET VALUES

(75) Inventor: Huili Yu, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 669 days.

(21) Appl. No.: 12/315,443

(22) Filed: Dec. 2, 2008

(65) Prior Publication Data

US 2010/0138177 A1 Jun. 3, 2010

(51) Int. Cl.
*G01R 31/36* (2006.01)
(52) U.S. Cl.
USPC .............................................. 702/63; 320/106
(58) Field of Classification Search
USPC .............. 702/61, 62, 63, 64, 65, 99; 320/134, 320/136, 144, 153, 162, 165, 106
See application file for complete search history.

(56) References Cited

U.S. PATENT DOCUMENTS

| | | | |
|---|---|---|---|
| 5,606,242 A * | 2/1997 | Hull et al. ..................... | 320/106 |
| 5,608,324 A | 3/1997 | Yoshida | |
| 5,744,963 A | 4/1998 | Arai et al. | |
| 6,025,695 A * | 2/2000 | Friel et al. ..................... | 320/106 |
| 6,150,823 A | 11/2000 | Takahashi et al. | |
| 6,469,471 B1 * | 10/2002 | Anbuky et al. ............... | 320/118 |
| 6,545,448 B1 * | 4/2003 | Stanley et al. ................ | 320/132 |
| 7,107,160 B2 * | 9/2006 | Bean ............................... | 702/63 |
| 7,218,118 B1 * | 5/2007 | Gonring ......................... | 324/429 |
| 7,960,945 B1 * | 6/2011 | Onorato et al. ............... | 320/132 |
| 2004/0117137 A1 * | 6/2004 | Jin et al. ......................... | 702/63 |
| 2005/0024020 A1 * | 2/2005 | Hogari et al. ................. | 320/132 |
| 2006/0097699 A1 * | 5/2006 | Kamenoff ..................... | 320/132 |
| 2007/0236183 A1 * | 10/2007 | Darilek ......................... | 320/132 |
| 2009/0055110 A1 * | 2/2009 | Kelley et al. ................... | 702/63 |
| 2010/0036628 A1 * | 2/2010 | Plestid ............................ | 702/63 |

* cited by examiner

*Primary Examiner* — John H Le
(74) *Attorney, Agent, or Firm* — Farjami & Farjami LLP

(57) ABSTRACT

A disclosed method comprises calibrating adaptive offset values in an open-circuit voltage lookup table, a temperature lookup table, and an age lookup table, and then determining a present charge of the battery utilizing an open-circuit voltage of the battery and a temperature of the battery, determining a low-voltage-alarm charge of the battery utilizing a discharge current of the battery and an age of the battery, and utilizing the present charge and the low-voltage-alarm charge to estimate the run time of the battery. Utilizing the open-circuit voltage, temperature, and age comprises looking up a present battery capacity, temperature coefficient, and ageing coefficient in lookup tables, and adjusting the present battery capacity, temperature coefficient, and ageing coefficient by the respective offset values adaptive to the battery.

20 Claims, 3 Drawing Sheets

METHOD FOR ACCURATE BATTERY RUN TIME ESTIMATION UTILIZING ADAPTIVE OFFSET VALUES

BACKGROUND OF THE INVENTION

1. Field of the Invention

The present invention is generally in the field of electronic devices. More particularly, the invention is in the field of battery and power management for electronic devices.

2. Background Art

Many modern electronic devices that are powered by a battery implement some method of monitoring the battery to estimate battery run time. For example, cellular telephones, portable music players, digital cameras, and other devices each typically include a circuit or subsystem implementing a method for monitoring the battery included in the device. Presently, two methods are typically used. The first method measures the battery voltage to estimate the battery run time, while the second method tracks the charge applied to and taken from the battery to estimate the battery run time. Both methods have attendant drawbacks.

For example, the first method, which monitors battery voltage, is inaccurate and only provides rough estimation for battery run time, because the relationship between battery voltage and battery capacity varies according to the load placed on the battery by the device. The load placed on the battery typically varies dynamically, thus making battery capacity and run time estimation difficult. The second method, which tracks the charge applied to and taken from the battery, can in some cases generate more accurate run time estimates than the first method. However, circuits or subsystems implementing the second method tend to be more expensive. Also, such circuits or subsystems are implemented in the battery of a device, instead of in the device itself, because otherwise tracked charge will become inaccurate when batteries are replaced. Furthermore, this method can suffer inaccuracies when tracked batteries are not deeply discharged and then fully charged.

Thus, there is a need in the art for a method for accurate battery run time estimation that overcomes the disadvantages associated with utilizing conventional methods.

SUMMARY OF THE INVENTION

A method for accurate battery run time estimation utilizing adaptive offset values, substantially as shown in and/or described in connection with at least one of the figures, and as set forth more completely in the claims.

DETAILED DESCRIPTION OF THE INVENTION

The present invention is directed to a method for accurate battery run time estimation utilizing adaptive offset values. Although the invention is described with respect to specific embodiments, the principles of the invention, as defined by the claims appended herein, can obviously be applied beyond the specific embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
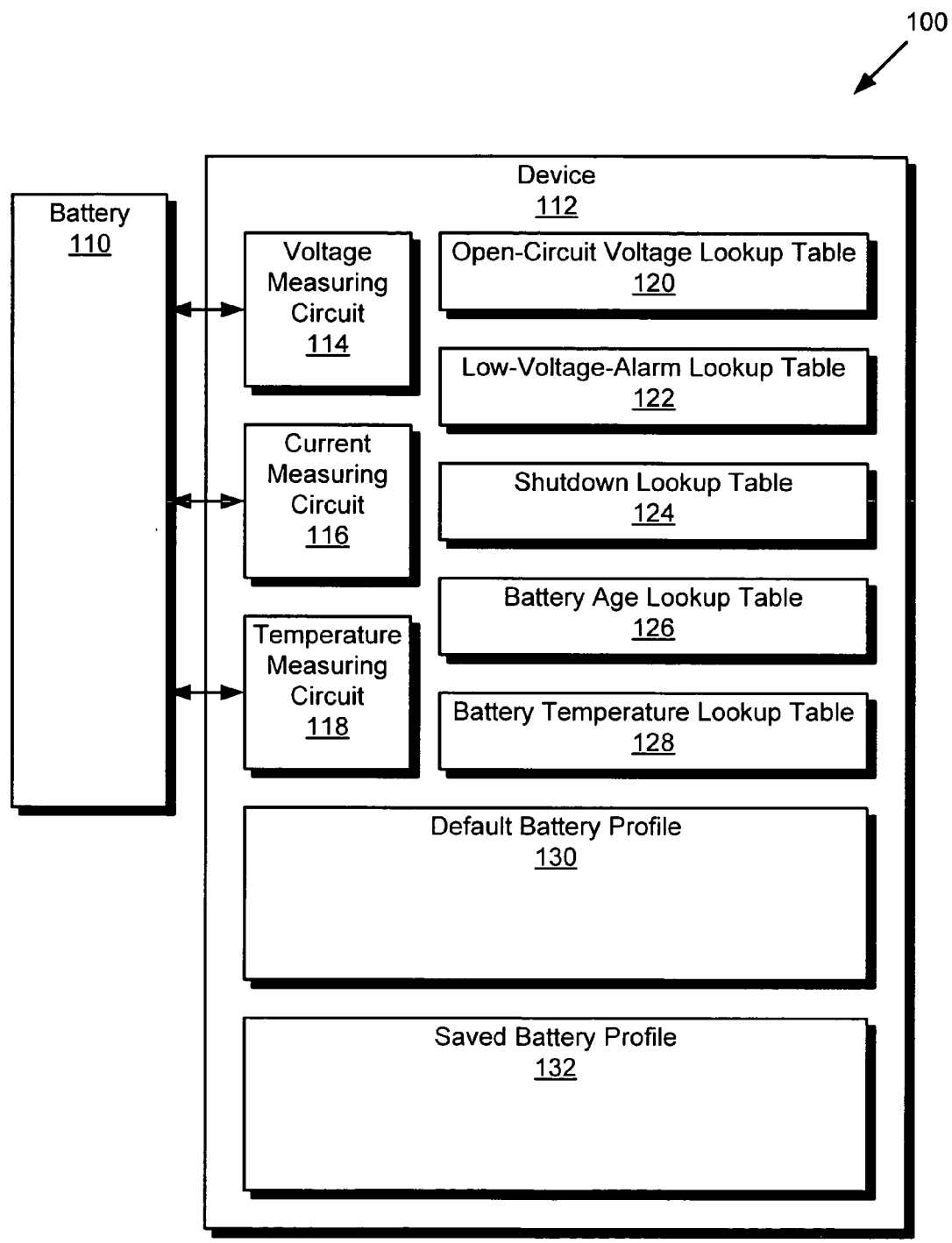
FIG. 1 shows an exemplary system for implementing one embodiment of the present invention.

In FIG. 1, system 100 for implementing one embodiment of the present invention is shown. System 100 includes battery 110 and device 112. Battery 110 comprises, in one embodiment, a lithium-ion battery by way of example. In another embodiment, battery 110 comprises a plurality of lithium-ion batteries coupled in series or parallel as known in the art. In yet another embodiment, battery 110 is implemented with a battery technology other than a lithium-ion battery. Battery 110 is configured, in one embodiment, to be coupled to device (or "electronic device") 112 to be discharged to provide energy for the operation of device 112, and also to be charged by receiving energy from device 112. In one embodiment, battery 110 also comprises a temperature sensor (e.g., a built-in thermistor) configured for use by device 112 to measure the battery temperature of battery 110.

Device 112 can be implemented in one embodiment as, for example, a cellular telephone, a portable music player, a digital camera, or another electronic device configured to receive energy from battery 110 and to provide energy to battery 110, and also to monitor the charge of battery 110. By monitoring the charge of battery 110, device 112 can estimate the remaining run time of battery 110. Generally, battery run time is indicated by a measure of time, such as seconds, minutes, and/or hours, and is dependent on, among other things, starting capacity of the battery, battery voltage, battery capacity decline rate, and other factors. In estimating the remaining run time of battery 110, in one embodiment, device 112 estimates when a low-voltage alarm will occur, in order to alert a user of device 112 that a shutdown is imminent.

Device 112 comprises, in one embodiment, voltage measuring circuit 114, current measuring circuit 116, and temperature measuring circuit 118 (hereinafter "measuring circuits 114 through 118"). Measuring circuits 114 through 118 are implemented using voltage, current, and temperature sensors. For example, in one embodiment, voltage measuring circuit 114 is implemented as a voltage sensor coupled to battery 110. Also, for example, current measuring circuit 116 is, in one embodiment, implemented utilizing a current-sensing resistor coupled to battery 110. Finally, for example, in one embodiment temperature measuring circuit 118 is implemented utilizing the temperature sensor (e.g., the built-in thermistor) of battery 110.

Device 112 also comprises, in one embodiment, a baseband processor and a nonvolatile memory (not shown). Measuring circuits 114 through 118 are, in one embodiment, coupled to the baseband processor of device 112, while in another embodiment, measuring circuits 114 through 118 are fabricated into the baseband processor of device 112. The baseband processor of device 112 is implemented, in one embodiment, as a microprocessor configured to perform flowchart 200 and flowchart 300 shown in FIG. 2 and FIG. 3, respectively, as described further below.

Device 112 also comprises open-circuit voltage lookup table 120, low-voltage-alarm lookup table 122, shutdown lookup table 124, battery age lookup table 126, and battery temperature lookup table 128 (hereinafter referred to collectively as "lookup tables 120 through 128"). In one embodiment lookup tables 120 through 128 are stored in the nonvolatile memory of device 112, and are loaded by the baseband processor for use during operation. In one embodiment, lookup tables 120 through 128 contain data about lithium-ion batteries such as battery 110 (e.g., contain data about lithium-ion batteries sharing characteristics of battery 110 within design tolerances). In one embodiment, the data in lookup tables 120 through 128 is generated during experimental trials carried out to characterize lithium-ion batteries using, for example, a plurality of lithium-ion batteries. The data in each of lookup tables 120 through 128 can be discussed in turn.

First, open-circuit voltage lookup table 120 contains open-circuit voltages associated with present battery capacities. Thus, for example, while performing flowcharts 200 and 300, the baseband processor of device 112 may look up an open-circuit voltage (e.g., represented in volts) in open-circuit voltage lookup table 120 to retrieve an associated present battery capacity (e.g., represented in amp-hours). Second, low-voltage-alarm lookup table 122 contains discharge currents associated with low-voltage-alarm battery capacities. Thus, for example, the baseband processor may look up a discharge current (e.g., represented in amps) in low-voltage-alarm lookup table 122 to retrieve an associated low-voltage-alarm battery capacity (e.g., represented in amp-hours). A low-voltage-alarm battery capacity is, in one embodiment, a battery capacity that results in a low-voltage alarm generated by device 112, indicating that a shutdown of device 112 is imminent.

Third, and similarly, shutdown lookup table 124 contains discharge currents associated with shutdown battery capacities. Thus, for example, the baseband processor may look up a discharge current in shutdown lookup table 124 to retrieve an associated shutdown battery capacity. Fourth, battery age lookup table 126 contains battery ages associated with ageing coefficients. Thus, for example, the baseband processor may look up a battery age (e.g., represented in hours) in battery age lookup table 126 to retrieve an associated ageing coefficient (e.g., a dimensionless coefficient). Fifth, battery temperature lookup table 128 contains battery temperatures associated with temperature coefficients to indicate the battery capacity relationship with the battery temperature. Thus, for example, the baseband processor may look up a battery temperature (e.g., represented in degrees Centigrade) in battery temperature lookup table 128 to retrieve an associated temperature coefficient (e.g., a dimensionless coefficient).

Device 112 further comprises, in one embodiment, default battery profile 130 and saved battery profile 132 (hereinafter "battery profiles 130 and 132"). Default battery profile 130 stores default data suitable for use with, for example, any lithium-ion battery, while saved battery profile 132 is associated with battery 110. Notably, in one embodiment system 100 comprises one or more batteries in addition to battery 110 that may be coupled to device 112 instead of battery 110. In such an embodiment, device 112 comprises one or more saved battery profiles in addition to saved battery profile 132, which are associated with the one or more additional batteries. Flowchart 300, discussed below, includes steps to identify a particular battery and to load and utilize the associated saved battery profile. In addition, flowcharts 200 and 300 include steps to utilize default battery profile 130 if a particular battery has not been identified. In one embodiment, battery profiles 130 and 132, as well as any additional saved battery profiles, are stored in the nonvolatile memory of device 112 and are loaded by the baseband processor for use during operation.

Battery profiles 130 and 132 (and additional saved battery profiles, in an embodiment utilizing one or more batteries in addition to battery 110) store, in one embodiment, an open-circuit voltage lookup table offset value, a battery age lookup table offset value, and a battery temperature lookup table offset value (hereinafter "lookup table offset values"). The lookup table offset values stored in default battery profile 130 are, in one embodiment, set to zero, and are, in another embodiment, set to nonzero default values suitable for use with a variety of batteries. In contrast, the lookup table offset values in saved battery profile 132 are characterized through lab experimental tests for a particular battery (e.g. for battery 110). Additionally, battery profiles 130 and 132 store a battery self-discharge current, a battery estimate error, a battery partial charge cycles counter, a battery full charge cycles counter, a battery inner resistance, a battery age, a battery total capacity estimate, and a battery last known open-circuit voltage (hereinafter "battery values").

Thus, as described above, device 112 comprises, in one embodiment, measuring circuits 114 through 118 and a baseband processor. Device 112 additionally comprises a non-volatile memory storing lookup tables 120 through 128 and battery profiles 130 and 132, which are in one embodiment loaded into the baseband processor during operation. As described below, flowcharts 200 and 300 (implemented as, for example, a software process executing on the baseband processor) utilize data from measuring circuits 114 through 118, data stored in lookup tables 120 through 128, and data stored in battery profiles 130 and 132 to estimate the remaining run time of battery 110.

Figure 2:
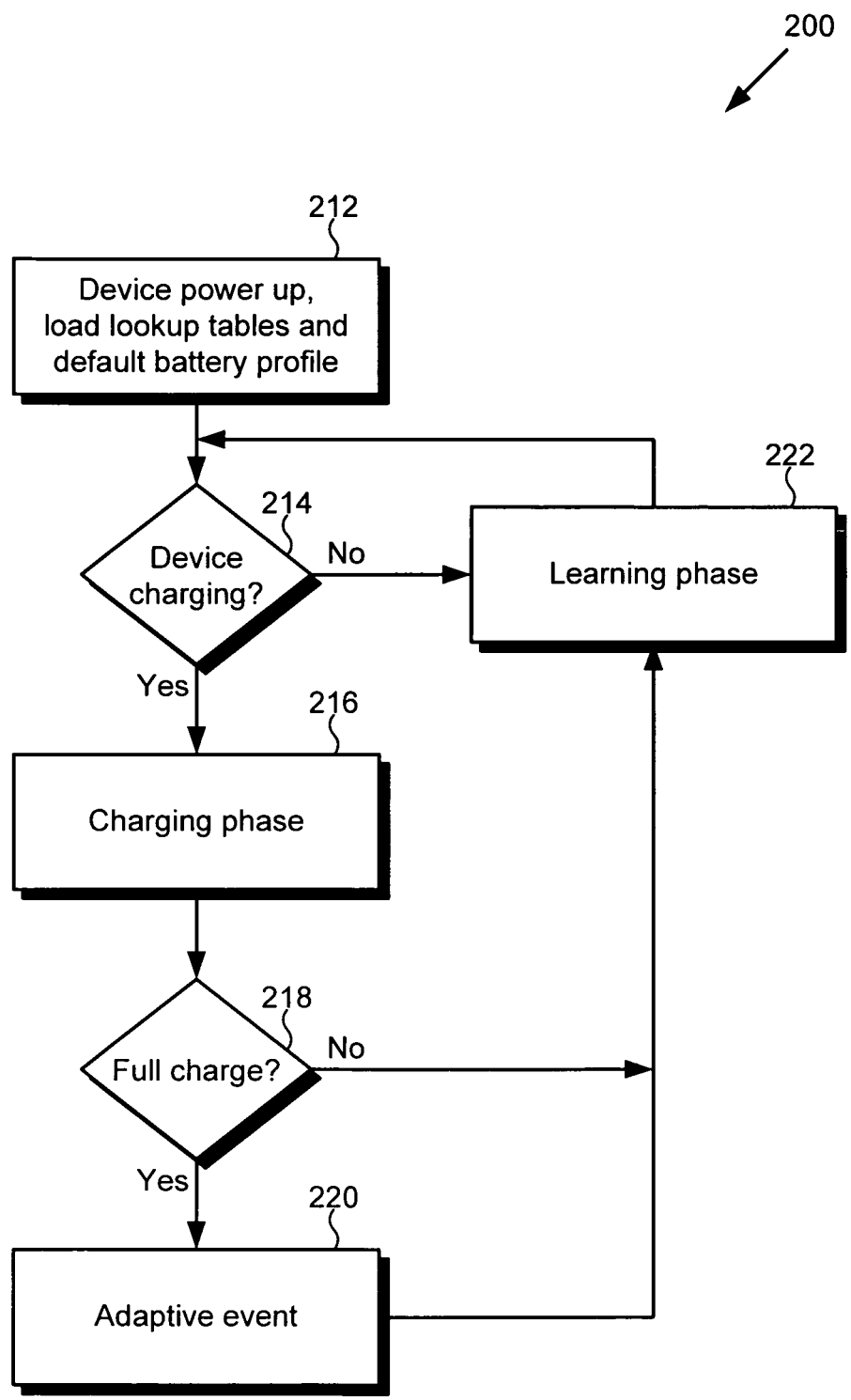
FIG. 2 shows a flowchart illustrating certain exemplary steps in a method used for battery run time estimation according to one embodiment of the present invention.

FIG. 2 shows flowchart 200 illustrating an exemplary method for battery run time estimation according to one embodiment of the present invention. Certain details and features have been left out of flowchart 200 that are apparent to a person of ordinary skill in the art. For example, a step may consist of one or more substeps or may involve specialized equipment or materials, as known in the art. Steps 212 through 222 indicated in flowchart 200 are sufficient to describe one embodiment of the present invention; however, other embodiments of the invention may utilize steps different from those shown in flowchart 200. It is noted that the steps shown in flowchart 200 are performed, in one embodiment, utilizing measuring circuits 114 through 118, lookup tables 120 through 128, and battery profiles 130 and 132 shown in FIG. 1. It is also noted that in one embodiment step 222 in FIG. 2 comprises flowchart 300 in FIG. 3, as discussed further below.

In step 212 of flowchart 200, device 112 powers up after, for example, being coupled to battery 110 and being turned on by a user of device 112. After being turned on, in one embodiment during step 212 the baseband processor of device 112 loads lookup tables 120 through 128 and default battery profile 130 from the nonvolatile memory for use during operation in subsequent steps of flowchart 200. Notably, in one embodiment, saved battery profile 132 is not loaded from the nonvolatile memory, because device 112 has not yet identified battery 110 which is, for example, associated with saved battery profile 132.

In step 214 of flowchart 200, device 112 determines whether battery 110 is being charged or is being discharged. Battery 110 is being charged when, for example, device 112 has been turned on, battery 110 is coupled to device 112, and device 112 is also coupled to a battery charger (e.g., to an electrical charging cable powered by an external power source as known in the art). In such a circumstance, in one embodiment the battery charger provides energy to both battery 110 and device 112, such that device 112 can operate while battery 110 charges. In contrast, battery 110 is being discharged when, for example, device 112 has been turned on, battery 110 is coupled to device 112, but device 112 is not coupled to a battery charger. In this latter circumstance, in one embodiment battery 110 discharges while providing the energy required for the operation of device 112. If in step 214 flowchart 200 determines that battery 110 is charging, flowchart 200 proceeds to step 216, but if battery 110 is not charging, flowchart 200 proceeds to step 222.

In step 216 of flowchart 200, battery 110 is being charged by, for example, the battery charger as described above. When finished, step 216 proceeds, in one embodiment, to step 218. Step 216 may finish after the battery charger is disconnected from device 112. In such a circumstance, a full charge may not have been achieved because, for example, the user of device 112 decided to use device 112 without waiting for a full charge. Step 216 may also finish, for example, after a full charge has been achieved, as indicated, for example, by an absence of current flowing from the battery charger to battery 10. If a full charge has been achieved in step 216, in step 218 flowchart 200 proceeds to step 220, but if a full charge has not been achieved, then in step 218 flowchart 200 proceeds to step 222.

In step 220 of flowchart 200, battery 10 has been fully charged by, for example, the battery charger as described above. After being fully charged, battery 110, for example, can be more accurately characterized. In particular, device 112 performs an adaptive event in step 220 in which default battery profile 130 (e.g., the copy of default battery profile 130 loaded by the baseband processor during previous step 212) is modified to record a new, more accurate characterization. Default battery profile 130 may be modified in one embodiment by, for example, modifying the battery full charge cycles counter, modifying the battery age, and modifying the battery total capacity estimate. In particular, in one embodiment the battery full charge cycles counter is incremented by one, the battery age is incremented by the amount of time spent charging in step 216, and the battery total capacity estimate is incremented by the amount of charge added to battery 110 during step 216, as measured by, for example, current measuring circuit 116.

Notably, in one embodiment, during the adaptive event of step 220 some of the battery values (e.g., the battery partial charge cycles counter, the battery self-discharge current, the battery estimate error, and the battery last known open-circuit voltage) and the lookup table offset values (e.g. the open-circuit voltage lookup table offset value, the battery age lookup table offset value, and the battery temperature lookup table offset value) in default battery profile 130 are not modified or adjusted. Instead, those battery values and lookup table offset values are modified, for example, during a subsequent learning phase in step 222 as discussed below.

After the adaptive event in step 220, wherein battery 110 is more accurately characterized as described above, flowchart 200 proceeds to step 222. Notably, if in previous step 218 flowchart 200 had determined that a full charge of battery 110 had not been achieved, flowchart 200 would have proceeded directly to step 222, instead of step 220. Similarly, if in step 214 flowchart 200 had determined that after device power up in step 212 that battery 110 was not being charged, flowchart 200 would have proceeded directly to step 222, instead of step 216, step 218, and possibly step 220. Thus, in one embodiment, all paths through flowchart 200 eventually lead to step 222, which comprises flowchart 300 in FIG. 3.

Figure 3:
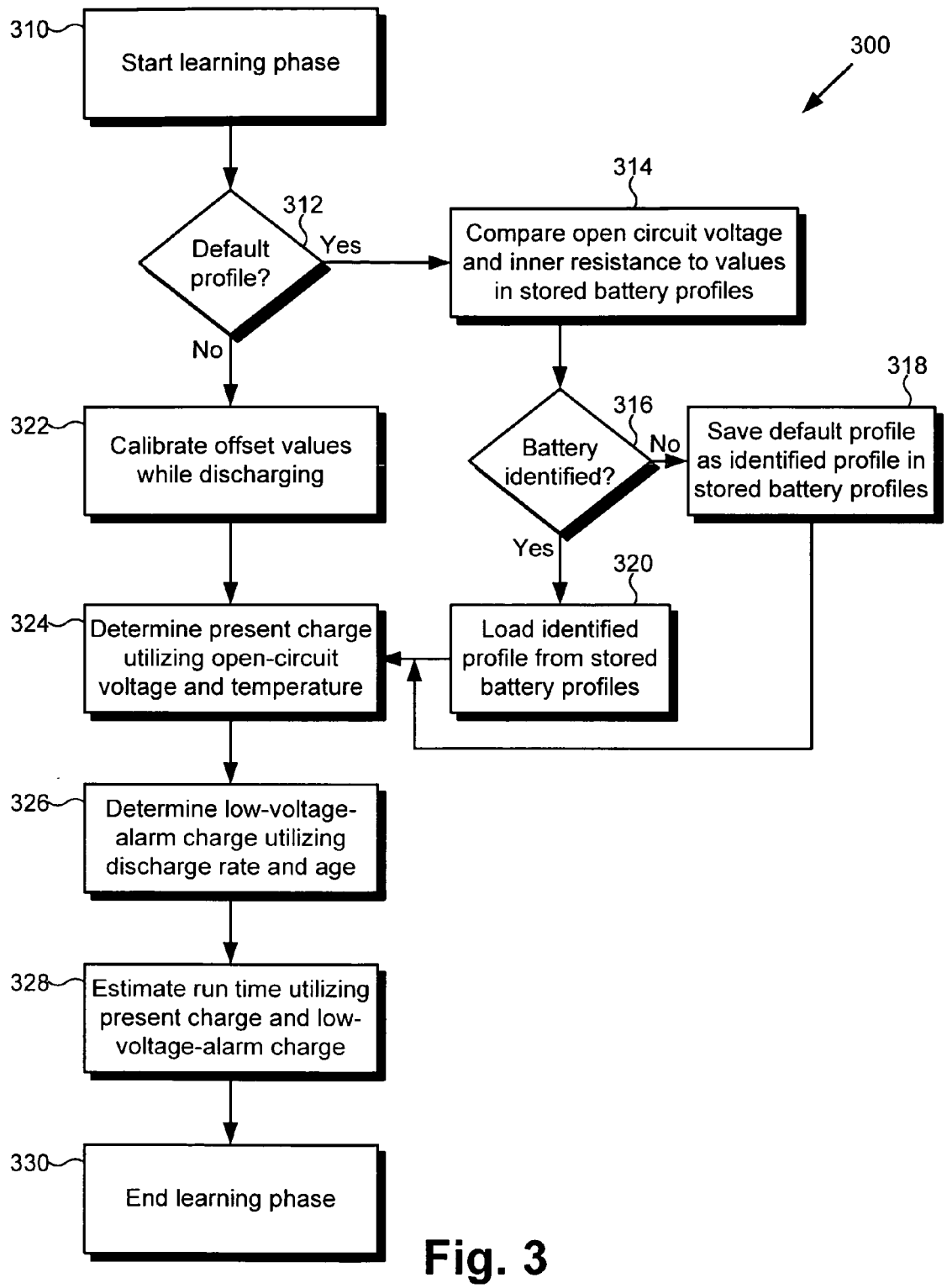
FIG. 3 shows a flowchart illustrating certain exemplary steps in a method used for battery run time estimation according to one embodiment of the present invention.

FIG. 3 shows flowchart 300 illustrating an exemplary method for battery run time estimation according to one embodiment of the present invention. Certain details and features have been left out of flowchart 300 that are apparent to a person of ordinary skill in the art. For example, a step may consist of one or more substeps, as known in the art. Steps 310 through 330 indicated in flowchart 300 are sufficient to describe one embodiment of the present invention; however, other embodiments of the invention may utilize steps different from those shown in flowchart 300. It is noted that the steps shown in flowchart 300 are performed, in one embodiment, utilizing measuring circuits 114 through 118, lookup tables 120 through 128, and battery profiles 130 and 132 shown in FIG. 1. It is also noted that, in one embodiment, step 310 at the beginning of flowchart 300 is reachable from step 222 in FIG. 2, and that step 222 is reachable from step 330 at the end of flowchart 300, as discussed further below.

In one embodiment, step 310 of flowchart 300 occurs after flowchart 200 enters step 222 from step 214, step 218, or step 220. Step 310 represents, in one embodiment, the beginning of a learning phase during which device 112 discharges battery 110, for example, and also monitors the charge on battery 110 to estimate battery run time. As described above in step 212, the baseband processor of device 112 loads default battery profile 130 prior to performing an identification of battery 110. Presently, in flowchart 300 after beginning the learning phase in step 310, if default battery profile 130 is still being utilized in step 312 (e.g., default battery profile 130 has not been replaced by a saved battery profile), flowchart 300 proceeds to step 314, but if a saved battery profile (e.g., saved battery profile 132) is being utilized, then in step 312 flowchart 300 proceeds to step 322. Notably, in the discussion of flowchart 200 above, a saved battery profile was not loaded by the baseband processor, and so flowchart 300 proceeds to step 314 to perform a battery identification. As described below, however, in one embodiment during the performance of flowchart 300 a saved battery profile will be loaded, and thus during a subsequent performance of flowchart 300, step 312 will instead proceed to step 322.

In step 314 of flowchart 300, flowchart 300 has determined (e.g., in one embodiment, the baseband processor performing flowchart 300 has determined) that default battery profile 130 is being utilized, which indicates that battery 110, for example, coupled to device 112 has not been identified. Thus, during step 314 device 112 attempts to identify the battery. In one embodiment, device 112 does so by comparing the open-circuit voltage and the inner resistance of battery 110 with the battery last known open-circuit voltage and the battery inner resistance stored in the saved battery profiles (e.g., in saved battery profile 132) of device 112. If, for example, both battery values match the measured values within a voltage or resistance threshold, respectively, then battery 110 is associated to the matching saved battery profile.

If flowchart 300 successfully matches battery 110 to a saved battery profile, then in one embodiment the saved battery profile (e.g., saved battery profile 132) is loaded in step 320, replacing default battery profile 130 that is being utilized, and flowchart 300 proceeds to step 324. However, if flowchart 300 cannot perform a match, then in step 318 default battery profile 130, presently being utilized, is saved as a new saved battery profile that is associated with, for example, battery 110. After step 318, flowchart 300 proceeds to step 324. Notably, after performing either step 318 or step 320, flowchart 300 proceeds to step 324 after either loading a saved battery profile, or saving default battery profile 130 as a new saved battery profile, respectively.

As described above, flowchart 300 arrives at step 324 after identifying the battery coupled to device 112, if device 112 had previously been utilizing default battery profile 130 during step 312. In contrast, flowchart 300 may also arrive at step 324 via step 322, if during step 312 device 112 had previously been utilizing a saved battery profile (e.g. saved battery profile 132) instead of default battery profile 130. Device 112 may have previously been utilizing a saved battery profile during step 312 if, for example, flowchart 200 had at least once previously performed a battery identification in flowchart 300.

If flowchart 300 had proceeded from step 312 to step 322, then in step 322 device 112 calibrates the lookup table offset values and several of the battery values in the saved battery profile being utilized (e.g., saved battery profile 132) by, in one embodiment, monitoring battery 110 while discharging. Specifically, the open-circuit voltage lookup table offset value, the battery temperature lookup table offset value, and the battery age lookup table offset value (e.g. the three lookup table offset values) in the saved battery profile being utilized are calibrated in step 322. In particular, each of the three lookup table offset values are calibrated in one embodiment by, for example, analyzing the difference between data from measuring circuits 114 through 118 and data looked up in lookup tables 120 through 128. Additionally, the battery partial charge cycles counter, the battery self-discharge current, the battery estimate error, and the battery last known open-circuit voltage in the saved battery profile being utilized are updated in step 322. After step 322, flowchart 300 proceeds to step 324.

In step 324, after either step 322, step 320, or step 318, flowchart 300 determines the present charge of the battery coupled to device 112 by utilizing the open-circuit voltage of the battery, the temperature of the battery, the open-circuit voltage lookup table offset value, and the battery temperature lookup table offset value. The open-circuit voltage is determined, in one embodiment, by measuring the open-circuit voltage of the battery during a sleep mode or during a paging wakeup mode utilizing, for example, voltage measuring circuit 114. The battery temperature determined, in one embodiment, by measuring the battery temperature utilizing, for example, temperature measuring circuit 118. After determining the open-circuit voltage and the battery temperature, the baseband processor of device 112 looks up the open-circuit voltage in open-circuit voltage lookup table 120 to retrieve an associated present battery capacity, and looks up the battery temperature in battery temperature lookup table 128 to retrieve an associated temperature coefficient. In one embodiment, the present charge is determined to be the present battery capacity adjusted by (e.g., added to) the open-circuit voltage lookup table offset value, multiplied by the temperature coefficient adjusted by (e.g., added to) the battery temperature lookup table offset value. Flowchart 300 then proceeds to step 326.

Having determined the present charge of the battery coupled to device 112 in step 324, in step 326 flowchart 300 determines the low-voltage-alarm charge of the battery coupled to device 112 utilizing the discharge current of the battery, the age of the battery, and the battery age lookup table offset value. The discharge current is determined, in one embodiment, by measuring the discharge current utilizing, for example, current measuring circuit 116. After determining the discharge current, the baseband processor looks up the discharge current in low-voltage-alarm lookup table 122 to retrieve an associated low-voltage-alarm battery capacity, and looks up the battery age in battery age lookup table 126 to retrieve an associated ageing coefficient. In one embodiment, the low-voltage-alarm charge is determined to be the low-voltage-alarm battery capacity, multiplied by the ageing coefficient adjusted by (e.g., added to) the battery age lookup table offset value.

In addition to determining the low-voltage alarm charge, in step 326 flowchart 300 also determines, in one embodiment, the shutdown charge of the battery coupled to device 112 utilizing the discharge current of the battery, the age of the battery, and the battery age lookup table offset value. The discharge current is determined, in one embodiment, by measuring the discharge current utilizing, for example, current measuring circuit 116. After determining the discharge current, the baseband processor looks up the discharge current in shutdown lookup table 124 to retrieve an associated shutdown battery capacity, and looks up the battery age in battery age lookup table 126 to retrieve an associated ageing coefficient. In one embodiment, the shutdown charge is determined to be the shutdown battery capacity, multiplied by the ageing coefficient plus the battery age lookup table offset value. After step 326, flowchart 300 then proceeds to step 328.

Having determined in one embodiment the present charge of the battery coupled to device 112 in step 324, and having determined in one embodiment the low-voltage-alarm charge and the shutdown charge of the battery coupled to device 112 in step 326, in step 328 flowchart 300 determines the estimated run time until a low-voltage alarm occurs and until a shutdown of device 112 occurs utilizing the present charge, the low-voltage-alarm charge, the shutdown charge, and the discharge current. In one embodiment, the estimated run time until a low-voltage alarm occurs is determined to be the present charge minus the low-voltage-alarm charge, divided by the discharge current. In one embodiment, the estimated run time until a shutdown of device 112 occurs is determined to be the present charge minus the shutdown charge, divided by the discharge current. Flowchart 300 then proceeds to step 330.

Step 330 represents the end of a learning phase, in one embodiment, during which device 112 discharged battery 110, for example, and also monitored the charge on battery 110 to estimate battery run time. In the learning phase, in one embodiment, flowchart 300 additionally updated table offset values in step 322 if a saved battery profile was being utilized, or identified battery 110 in step 314, step 316, step 318, and step 320 if default battery profile 130 was being utilized. After step 330, flowchart 300 terminates and, in one embodiment, proceeds to step 222 of flowchart 200, wherein flowchart 200 proceeds to step 214.

In step 214 of flowchart 200, after step 222, in one embodiment device 112 again determines whether battery 110 is being charged or is still being discharged. If battery 110 is still being discharged, flowchart 200 returns to step 222 to perform another learning phase in flowchart 300, whereby another estimate of battery run time can be determined. However, if battery 110 is being charged (e.g., device 112 has been coupled to a battery charger) flowchart 200 proceeds to step 216 to repeat a charging phase, and if a full charge is accomplished to repeat an adaptive event in step 220, before returning to step 222 to perform another learning phase in flowchart 300.

The invention's unique use of, for example, lookup tables, battery profiles storing offset values calibrated for particular batteries, adaptive events following full charges, and calibrations during discharges permits the estimation of battery run time with several advantages as described above. The invention avoids problems associated with conventional solutions, such as, for example, the imprecision associated with conventional solutions that utilize only the battery voltage to estimate run time. The invention, for example, also avoids the necessity of implementing charge-tracking circuits or subsystems in each battery utilized by a device, instead of in the device itself, associated with conventional charge-tracking solutions. Furthermore, for example, the invention avoids the inaccuracies of conventional charge-tracking solutions when tracked batteries are not deeply discharged and then fully charged.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A method for execution by a processor, said method for accurately estimating a run time of a battery, the method comprising:
   loading an adjustable default battery profile using said processor prior to identifying said battery;
   loading an associated battery profile from a plurality of saved battery profiles after said loading said adjustable default battery profile, said associated battery profile corresponding to said battery;
   calibrating offset values in an open-circuit voltage lookup table, a temperature lookup table, and an age lookup table corresponding to said battery;
   determining a present charge of said battery utilizing said open-circuit voltage look up table and said temperature look up table;
   determining a low-voltage-alarm charge of said battery utilizing a discharge current of said battery and said age lookup table;
   utilizing said present charge and said low-voltage-alarm charge to estimate said run time of said battery.

2. The method of claim 1, wherein said determining said present charge comprises looking up a present battery capacity in said open-circuit voltage lookup table.

3. The method of claim 2, further comprising adjusting said present battery capacity utilizing an offset value in said open-circuit voltage lookup table.

4. The method of claim 1, wherein said determining said present charge comprises looking up a temperature coefficient in said temperature lookup table.

5. The method of claim 4, further comprising adjusting said temperature coefficient utilizing an offset value in said temperature lookup table.

6. The method of claim 1, wherein said determining said low-voltage-alarm charge comprises looking up a low-voltage-alarm battery capacity in a low-voltage-alarm lookup table.

7. The method of claim 1, wherein said determining said low-voltage-alarm charge comprises looking up an ageing coefficient in said age lookup table.

8. The method of claim 7, further comprising adjusting said ageing coefficient utilizing an offset value in said age lookup table.

9. The method of claim 1, wherein said utilizing said present charge and said low-voltage-alarm charge comprises dividing a difference of said present charge and said low-voltage-alarm charge by said discharge current to estimate said run time of said battery.

10. The method of claim 1, further comprising determining a shutdown charge of said battery utilizing said discharge current of said battery and an age of said battery.

11. The method of claim 10, further comprising utilizing said present charge and said shutdown charge to estimate said run time of said battery.

12. A method for execution by a processor, said method for accurately estimating a run time of a battery, the method comprising:
   loading an adjustable default battery profile using said processor prior to identifying said battery;
   loading an associated battery profile from a plurality of saved battery profiles after said loading said adjustable default battery profile, said associated battery profile corresponding to said battery;
   calibrating offset values in an open-circuit voltage lookup table, and a temperature lookup table corresponding to said battery;
   determining an open-circuit voltage of said battery;
   determining a discharge current of said battery;
   determining a temperature of said battery;
   utilizing said offset values, said open-circuit voltage, said discharge current, and said temperature to estimate said run time of said battery.

13. The method of claim 12, wherein said utilizing said open-circuit voltage comprises looking up a present battery capacity in said open-circuit voltage lookup table.

14. The method of claim 13, further comprising adjusting said present battery capacity utilizing an offset value in said open-circuit voltage lookup table.

15. The method of claim 12, wherein said utilizing said temperature comprises looking up a temperature coefficient in said temperature lookup table.

16. The method of claim 15, further comprising adjusting said temperature coefficient utilizing an offset value in said temperature lookup table.

17. The method of claim 12, wherein said utilizing said discharge current comprises looking up a low-voltage-alarm battery capacity in a low-voltage-alarm lookup table.

18. The method of claim 12, further comprising utilizing an age of said battery.

19. The method of claim 18, wherein said utilizing said age comprises looking up an ageing coefficient in an age lookup table.

20. The method of claim 19, further comprising adjusting said ageing coefficient utilizing an adaptive offset value in said age lookup table.

* * * * *